United States Patent [19]
Matsunaga

[11] Patent Number: 5,950,444
[45] Date of Patent: Sep. 14, 1999

[54] ELECTRONIC APPARATUS

[75] Inventor: Yoshinori Matsunaga, Soraku-gun, Japan

[73] Assignee: Kyocera Corporation, Kyoto, Japan

[21] Appl. No.: 09/085,674

[22] Filed: May 27, 1998

[30] Foreign Application Priority Data

May 28, 1997 [JP] Japan ................................. P9-138937

[51] Int. Cl.$^6$ .............................. E21B 33/12; H05K 7/20
[52] U.S. Cl. .......................... 62/259.2; 165/185; 361/713
[58] Field of Search ................................. 62/51.1, 259.2; 165/185; 361/704, 707, 713

[56] References Cited

U.S. PATENT DOCUMENTS

| | | | |
|---|---|---|---|
| 3,902,143 | 8/1975 | Fletcher et al. ........................ | 333/21 R |
| 3,946,141 | 3/1976 | Schmidt ................................. | 174/11 R |
| 5,442,131 | 8/1995 | Borgwarth ............................. | 174/15.6 |

OTHER PUBLICATIONS

"A Receiver Front End for Wireless Base Stations"–Microwave Journal, Apr. 1996, vol. 39, No. 4, Published by Horizon House Publications.

Primary Examiner—William Doerrler
Attorney, Agent, or Firm—Loeb & Loeb LLP

[57] ABSTRACT

Since, due to heat flowing from the outside through central conductors of cables or connectors into an electronic circuit that is operated in a state of being cooled to a low temperature, a temperature distribution or local temperature rising occurs in the electronic circuit, a desired characteristic cannot be obtained for the electronic circuit. There is disclosed an electronic apparatus comprising an electronic device accommodated in a vacuum heat insulation housing, provided with an electronic circuit which is cooled to a temperature between 4 K. and 150 K. to operate, and an input/output coaxial connector of which central conductor is hold by a dielectric having a heat conductivity of 10 W/m·K. or more at the temperature between 4 K. and 150 K.; and cooling means accommodated in the vacuum heat insulation housing, for cooling the electronic device to the temperature between 4 K. and 150 K via a cooling introduction member connected with the input/output coaxial connector, wherein the electronic device is mounted in a state of being separated from the cooling means. Since the problem of heat flow from the outside into the electronic circuit is eliminated, the electronic circuit is stably operated.

6 Claims, 7 Drawing Sheets

ELECTRONIC APPARATUS

BACKGROUND OF THE INVENTION

1. Field of the Invention

The present invention relates to an electronic apparatus with an electronic device such as an infrared detector in an infrared temperature detecting apparatus or a superconducting microwave circuit apparatus, which is used with an electronic device which is accommodated in a vacuum case and equipped with an electronic circuit which is operated in a state of being cooled to a temperature of 150 K. or less, more specifically to a structure for cooling the electronic device in such electronic apparatus.

2. Description of the Related Art

Conventionally, an electronic device having an electronic circuit which is operated in a low temperature environment, more specifically at a temperature of 150 K. or less, e.g. at a cryogenic temperature between 4 K. and 150 K. close to the liquid nitrogen temperature (about 77 K.) and the liquid helium temperature (about 4 K.), respectively, such as an infrared detector in an infrared temperature detecting apparatus or a superconducting microwave circuit apparatus, constitutes an electronic apparatus in such a manner that the electronic device is mounted on a mounting portion of an electronic device case comprising a vacuum heat insulation housing in which cooling means having a cooling structure and the mounting portion for the electronic device, which cooling means is called a cold head, is disposed, so as to be accommodated in the vacuum heat insulation housing and the electronic device is connected to an external circuit. The electronic device is used under constant temperature and environment conditions by operating the electronic circuit while the electronic device is cooled to a desired low temperature by the cooling structure.

FIG. 7 is a section view showing an example of such prior art electronic apparatus. In FIG. 7, a vacuum heat insulation housing 1 accommodates a cold head 2 which constitutes cooling means together with a refrigerator or the like, and an electronic device 4 is provided with an electronic circuit 3 operated at a temperature between 4 K. and 150 K. The electronic device 4 is directly mounted on the cold head 2 of the cooling means to be accommodated in the vacuum heat insulation housing 1.

A vacuum sealed housing-side input/output connector 5 is provided so as to penetrate a housing wall of the vacuum heat insulation housing 1. An input/output coaxial connector 6 is attached to the electronic device 4 and electrically connected to the electronic circuit 3. A cable 7 electrically connects the housing-side input/output connector 5 and the input/output coaxial connector 6, and a cable 7' electrically connects an external electric circuit and the housing-side input/output connector 5.

In the conventional electronic device input/output of an electrical signal between the external electric circuit and the electronic device 4 in the electronic apparatus is executed via the cable 7', the housing-side input/output connector 5, cable 7 and the input/output coaxial connector 6, and the electronic circuit 3 is operated under cooled condition by cooling a bottom surface of the main body of the electronic device 4 by the cold head 2 connected with the refrigerator.

FIGS. 8A to 8C show front views and side views of the housing-side input/output connector 5, the input/output coaxial connector 6 and the cable 7, respectively. These drawings allocate a front view in the center and side views of both sides on both sides of the front view. In FIG. 8C, a section view of a central portion of the front view is also shown.

In the housing-side input/output connector 5 shown in FIG. 8A, outer conductors 8, 8' are ground-side conductors, central conductors 9, 9' transmit electrical signals, and dielectrics 10, 10' interposed between the outer conductors 8, 8' and the central conductors 9, 9' hold the central conductors 9, 9' to electrically insulate both conductors. Female connectors 11 are connected to the cables 7, 7' at the inside and outside of the vacuum heat insulation housing 1, and a gasket 12 is pressed on the housing wall of the vacuum heat insulation housing 1 to execute vacuum sealing.

In the input/output coaxial connector 6 shown in FIG. 8B, outer conductors 13, 13' are ground-side conductors, central conductors 14, 14' transmit electrical signals, and dielectrics 15, 15' interposed between the outer conductors 13, 13' and the central conductors 14, 14' hold the central conductors 14, 14' to electrically insulate both conductors. A female connector 16 is connected to the cable 7.

In the cable 7 shown in FIG. 8C, outer conductors 17, 17' are ground-side conductors, central conductors 18, 18' transmit electrical signals, and dielectrics 19, 19' interposed between the outer conductors 17, 17' and the central conductors 18, 18' hold the central conductors 18, 18' to electrically insulate the central and outer conductors. A male connector 20 is connected to the housing-side input/output connector 5 or the input/output coaxial connector 6. The cable 7' has almost the same constitution.

As shown in FIGS. 8A to 8C, any of the housing-side input/output connector 5, the input/output coaxial connector 6, and the cable 7 in the conventional electronic apparatus are constructed of the central conductors 9, 9', 14, 14', 18, 18' and the dielectrics lo, 10', 15,15', 19, 19' holding the central conductors, although there are differences of whether or not the dielectrics are surrounded by the outer conductors.

In the above described conventional electronic apparatus, however, dielectric materials having a good electrical insulation property and a poor heat conductivity, such as polymeric materials, e.g. tetrafluoro ethylene resin (having a heat conductivity of about 0.3 W/m·K.) are used in producing the dielectrics 10, 10', 15, 15', 19, 19' of the housing-side input/output connector 5, input/output coaxial connector 6, and the cable 7 because such dielectric materials have low dielectric constants and are easily worked and fabricated into a desired object. On the other hand, such polymeric materials have very poor heat conductivity, so that the ability of heat radiation from the central conductors 9, 9', 14, 14' is very poor, when such polymeric materials are used for the dielectrics 10, 10', 15, 15'.

Accordingly, even if the electronic device 4 is cooled by the cold head 2 in the vacuum heat insulation structure, heat is transmitted from the outside of the electronic apparatus via the central conductors 9, 9' of the housing-side input/output connector 5 and the central conductors 18, 18' of the cable 7 to the electronic circuit 3 in the electronic device 4 because of low cooling efficiencies of the central conductors 14, 14' held by the dielectrics 15, 15' in the input/output coaxial connector 6, and as a result, it becomes difficult to cool the electronic device 4 efficiently and sufficiently, and a problem that a stable operation of the electronic circuit 3 is difficult due to the temperature distribution generated on it.

FIG. 9 is a perspective view showing a heat flow into the electronic device 4 through the input/output coaxial connector 6. In FIG. 9, the same elements as in FIGS. 7 and 8 are denoted by the same reference numerals, and a dotted arrow denotes the heat flow.

As shown in FIG. 9, in the case of the electronic device 4 of the conventional electronic apparatus, since the heat conductivity of the dielectric 15 of the input/output coaxial connector 6 is poor, the heat having passed through the central conductor 14 from the outside is not radiated to the outside through the dielectric 15 but passes through the central conductor 14 as it is to reach the electronic circuit 3 and diffuse in the electronic circuit 3.

In the conventional electronic apparatus as mentioned above, even if the electronic device 4 is configured to be a vacuum heat insulation structure and then the electronic device 4 is cooled, the heat inflow from the outside is transmitted through the central conductor 14 to flow in to the electronic device 4 because of the low cooling efficiency of the central conductor 14 of the connector 6, which brings a temperature distribution in electronic circuit 3 and a local temperature rising within the electronic circuit 3.

Therefore, a problem arises that the characteristics of the electronic circuit 3 as initially designed cannot be obtained. Particularly, in the case where the electronic device 4 that is used in a state of being cooled to a very low temperature such as the liquid nitrogen temperature has the electronic circuit 3 made of a superconducting film, a local temperature rising destroy the superconducting condition, which causes the characteristics of the electronic circuit 3 to be significantly degraded.

SUMMARY OF THE INVENTION

The invention was accomplished in view of the problems in the above prior art, and is directed to provide an electronic apparatus having an efficient cooling structure, which Is suitable for accommodating and stably operating an electronic device having an electronic circuit that is operated in a state of being cooled to a low temperature between 4 K. and 150 K.

The invention provides an electronic apparatus comprising:

an electronic device accommodated in a vacuum heat insulation housing, provided with an electronic circuit which is cooled to a temperature between 4 K. and 150 K. to operate, and an input/output coaxial connector; and cooling means accommodated in the vacuum heat insulation housing, for cooling the electronic device to the temperature between 4 K. and 150 K. via a cooling introduction member connected with the input/output coaxial connector, wherein the electronic device is mounted in a state of being separated from the cooling means and the input/output coaxial connector is constructed to hold a central conductor with a dielectric having a heat conductivity of 10 W/m·K. or more at the temperature between 4 K and 150 K.

According to the electronic apparatus of the invention, an electronic device provided with an electronic circuit which is operated in a state of being cooled to a temperature between 4 K. and 150 K. is mounted via the cooling introduction member connected to the input/output coaxial connector of the electronic device so that the electronic device is separated from the cooling means. Also, the input/output coaxial connector of the electronic device is so constituted that the central conductor is held by the dielectric having the heat conductivity of 10W/m·K. or more at the temperature between 4 K and 150 K. With this constitution, as the input/output coaxial connector is intensively cooled and the central conductor of the input/output coaxial connector is efficiently cooled via the dielectric holding it and having a high heat conductivity, the heat from the outside no longer passes through the central conductor and the heat generated in the electronic circuit is efficiently radiated from the central conductor to the cooling means via the dielectric of the input/output coaxial connector. Therefore, temperature distribution in the electronic circuit and local temperature rising in the electronic circuit occur no longer.

Further, it is possible to eliminate the problem that the characteristic of the electronic circuit as initially designed cannot be obtained, and even when a superconducting thin film is used as the electronic circuit operated in the state of being cooled to a temperatures near the cryogenic temperatures, the local temperature rising will not break the super conductive condition and significantly degrade the characteristics of the electronic circuit. As a result, the electronic apparatus capable of stably operating the electronic circuit which is operated in the state of being cooled to the temperature between 4 K. and 150 K. can be realized.

The invention is characterized in that the dielectric of the input/output coaxial connector is formed of a sintered aluminum oxide material, a sintered aluminum nitride material or a sintered silicon carbide material.

In the case where the dielectric of the input/output coaxial connector is formed of a sintered aluminum oxide material, a sintered aluminum nitride material or a sintered silicon carbide material, the electronic apparatus having a high cooling efficiency and capable of operating the electronic circuit which is operated in a state of being cooled to the temperature between 4 K. and 150 K. can be realized because these materials have high heat conductivity and high electrical insulation performance, and the heat conductivity thereof increases as the temperature drops.

Further, the invention is characterized in that the input/output coaxial connector is a coaxial connector to which a semi-rigid coaxial cable with an outer conductor exposed outside can be connected.

Since the semi-rigid coaxial cable of which outer conductor is exposed outside is connected to the input/output coaxial connector, an electric signal with high frequency is inputted to/outputted from the electronic circuit of the electronic device with low loss and low distortion via the coaxial cable.

Further, the invention is characterized in that a semi-rigid coaxial cable is connected to the input/output coaxial connector, and that the dielectric of the semi-rigid coaxial cable has a heat conductivity of 10W/m·K. or more at the temperature between 4 K. and 150 K.

According to the invention, since the central conductor of the semi-rigid coaxial cable of which outer conductor is exposed outside is held by the dielectric having high heat conductivity as is the input/output coaxial connector, it is possible to prevent the heat inflow from the external in the case of the coaxial cable.

In this way, an electronic apparatus having an efficient cooling structure, which is suitable for accommodating and stably operating an electronic device having an electronic circuit that is operated in a state of being cooled to a low temperature between 4 K. and 150 K. can be provided.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
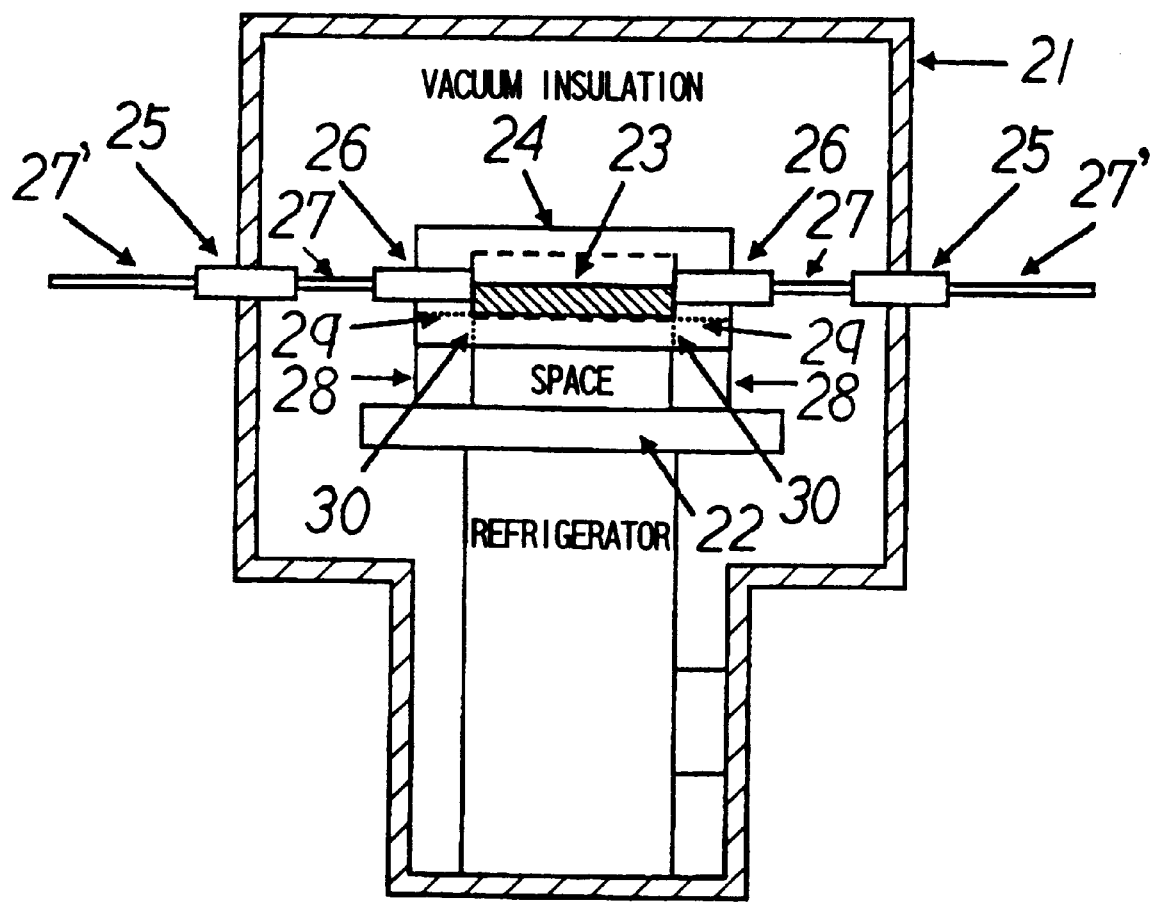
FIG. 1 is a section view showing an example of an embodiment of an electronic apparatus according to the present invention.

Now referring to the drawings, preferred embodiments of the invention are described below.

FIG. 1 is a section view of an example of an embodiment of an electronic apparatus of the invention.

In FIG. 1, a vacuum heat insulation housing 21 accommodates a cold head 22 which constitutes cooling means together with a refrigerator or the like, and an electronic device 24 is provided with an electronic circuit 23 operated at a temperature between 4 K. and 150 K. The electronic circuit 23 is usually mounted on a main body of the electronic device 24.

A housing-side input/output connector 25 which is vacuum sealed is provided so as to penetrate a housing wall of the vacuum heat insulation housing 21, an input/output coaxial connector 26 is mounted on the electronic device 24 and electrically connected to the electronic circuit 23, a cable 27 electrically connects the housing-side input/output connector 25 and the input/output coaxial connector 26, and a cable 27' electrically connects an external electric circuit and the housing-side input/output connector 25. Usually, coaxial cables are used for the cables 27, 27', and a coaxial connector is used for the housing-side input/output connector 25.

A cooling introduction member 28 provided on the cold head 22 of the cooling means contacts with the input/output coaxial connector 26, and by interposing such cooling introduction member 28, the electronic device 24 is accommodated in the vacuum heat insulation housing 21 while the main body of the electronic device 24 is separated from the cold head 22. In addition, the input/output coaxial connector 26 is cooled by the cold head 22 via the cooling introduction member 28.

Figure 2:
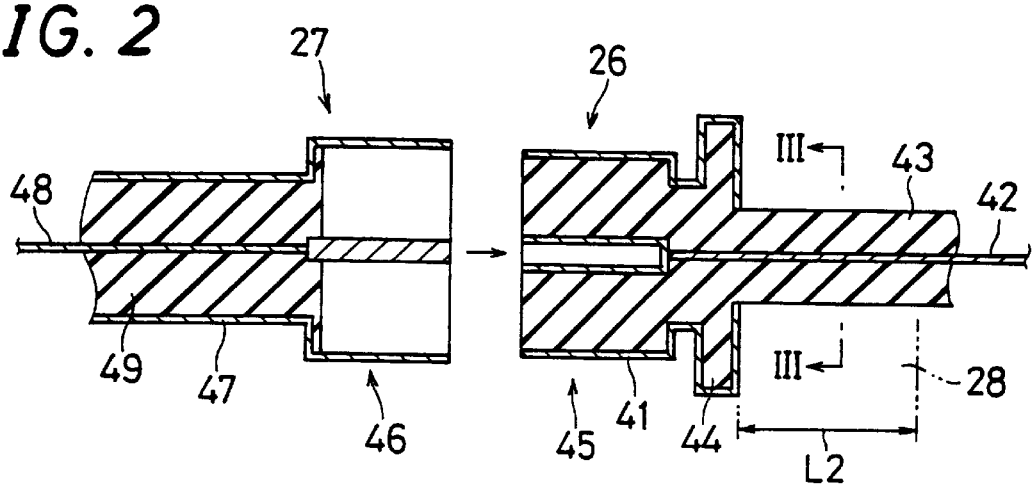
FIG. 2 is a section view showing a connecting condition between an input/output coaxial connector and a cable.
Figure 3A:
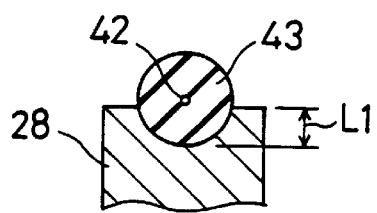
FIGS. 3A and 3B are section views showing a relationship between the input/output coaxial connector and a cooling introduction member.

FIG. 2 is a section view showing a relationship between the input/output coaxial connector 26 and the cable 27 to be connected to the input/output coaxial connector 26. FIG. 3A is a section view cut on the cutting line III—III of FIG. 2. For adjusting a contacting area between the cooling introduction member 28 and the input/output coaxial connector 26, lengths represented by the numeral L1 in FIG. 3A and numeral L2 in FIG. 2 are increased or decreased. In this manner, a contacting area required for cooling the input/output coaxial connector 26 by heat transmission can be obtained, and the input/output coaxial connector 26 is intensively cooled by the cooling introduction member 28.

The input/output coaxial connector 26 comprises an outer conductor 41 which is a ground-side conductor, a central conductor 42 for transmitting an electrical signal, and a dielectric 43 for electrically insulating the central conductor 42 from the outer conductor 41 by holding the central conductor 42 in its center. The outer conductor 41 is provided with a collar 44, and in a region on the side approaching the electronic circuit 23 from the collar 44 (the rightward in FIG. 2) where the outer conductor 41 is not disposed, the cooling introduction member 28 is made into contact with the dielectric 43 so as to cool the same. The dielectric 43 has a heat conductivity of 10 W/m·K. or more at the temperature between 4 K. and 150 K., and specifically is made of sintered aluminum oxide material, sintered aluminum nitride material, or sintered silicon carbide material. The cable 27 is configured as a coaxial cable, and comprises an outer conductor 47, a central conductor 48, and a dielectric 49 disposed between the outer conductor 47 and the central conductor 48 to hold the central conductor 48 at the center of the cable 27 for electrically insulating the outer and central conductors to each other. The cable 27 may have a constitution that the outer conductor 47 is formed of a mesh-like member and the outer conductor 47 is coated with an outer surface of a protecting film. A constitution in which the outer conductor 47 which is formed of a tubular member and exposed to the outside is more preferable for input/output of electric signals with high frequency. A connector portion 46 of the cable 27 with the form of a male type is fitted into a connector portion 45 of the input/output coaxial connector 26 with the form of a female type. As a result of this, the outer conductors 47 and 41, and the central conductors 48 and 42 are respectively connected between the cable 27 and the input/output coaxial connector 26.

Figure 4:
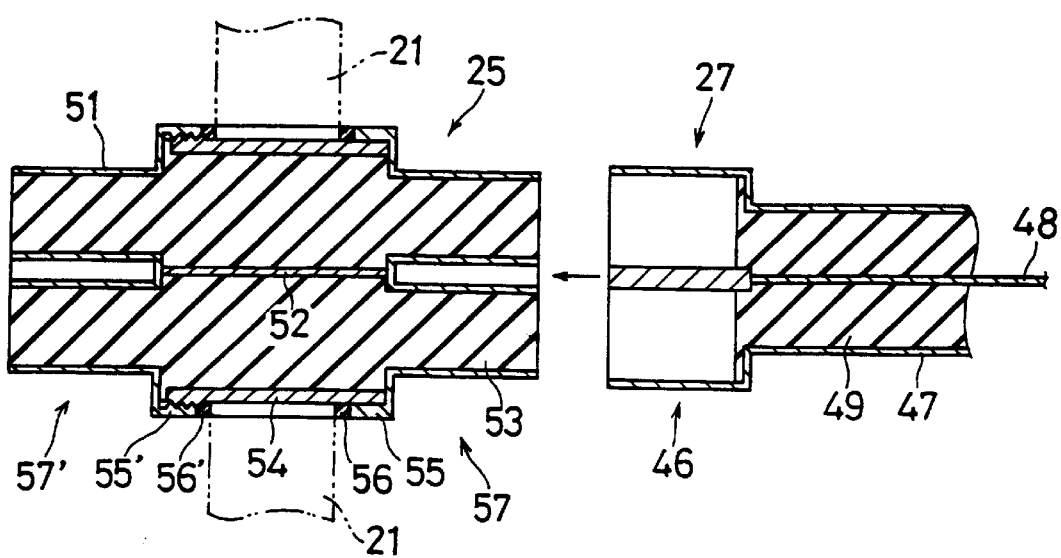
FIG. 4 is a section view showing a connecting condition between a housing-side input/output connector and the cable.

FIG. 4 is a longitudinal section view showing the housing-side input/output connector 25 and the cable 27 to be connected to the input/output connector 25. The housing-side connector 25 is configured as a coaxial connector, and comprises an outer conductor 51, a central conductor 52, a dielectric 53 disposed between the outer conductor 51 and the central conductor 52 to hold the central conductor 52 at the center of the housing-side input/output connector 25, for electrically insulating the conductors to each other. The outer conductor 51 includes a through portion 54 penetrating the wall surface of the vacuum heat insulation housing 21, collars 55, 55' sandwiching the through portion 54 from both sides, gaskets 56, 56' for vacuum sealing the wall surface of the vacuum heat insulation housing 21 with the collars 55, 55', and the connector portions 57, 57' connecting with the collars 55, 55'. The through portion 54 attached with the gasket 56 of the vacuum heat insulation housing 21 side, the collar 55 and the connector portion 57 is arranged so that the through portion 54 penetrates the wall surface of the housing 21 from inside to outside thereof, and then the gasket 56', the collar 55' and the connector portion 57' are attached. An outside screw is engraved on the outside of the through portion 54, and an inside screw is engraved on the collar 55'. The housing-side input/output connector 25 can be attached to the vacuum heat insulation housing 21 by screwing these screws to each other with being vacuum sealed by means of the gasket 56, 56'. The connector portion 46 of the cable 27 has the same constitution as FIG. 2 except the left and light sides being inverted, so an explanation for this portion will be omitted. Also, the connector portion of the cable 27' has the same constitution. The connector portion 57 of the housing-side input/output connector 25 is formed into a female type, and the connector portion 57 is fitted into the connector portion 46 of the cable 27 which is formed into a male type. As a result of this, the outer conductors 47 and 51, and the central conductors 48 and 52 are respectively connected between the cable 27 and the housing-side input/output connector 25. The connector portion 57' of the housing-side input/output connector 25 is connected with the cable 27' from outside of the housing in the same manner.

Figure 5:
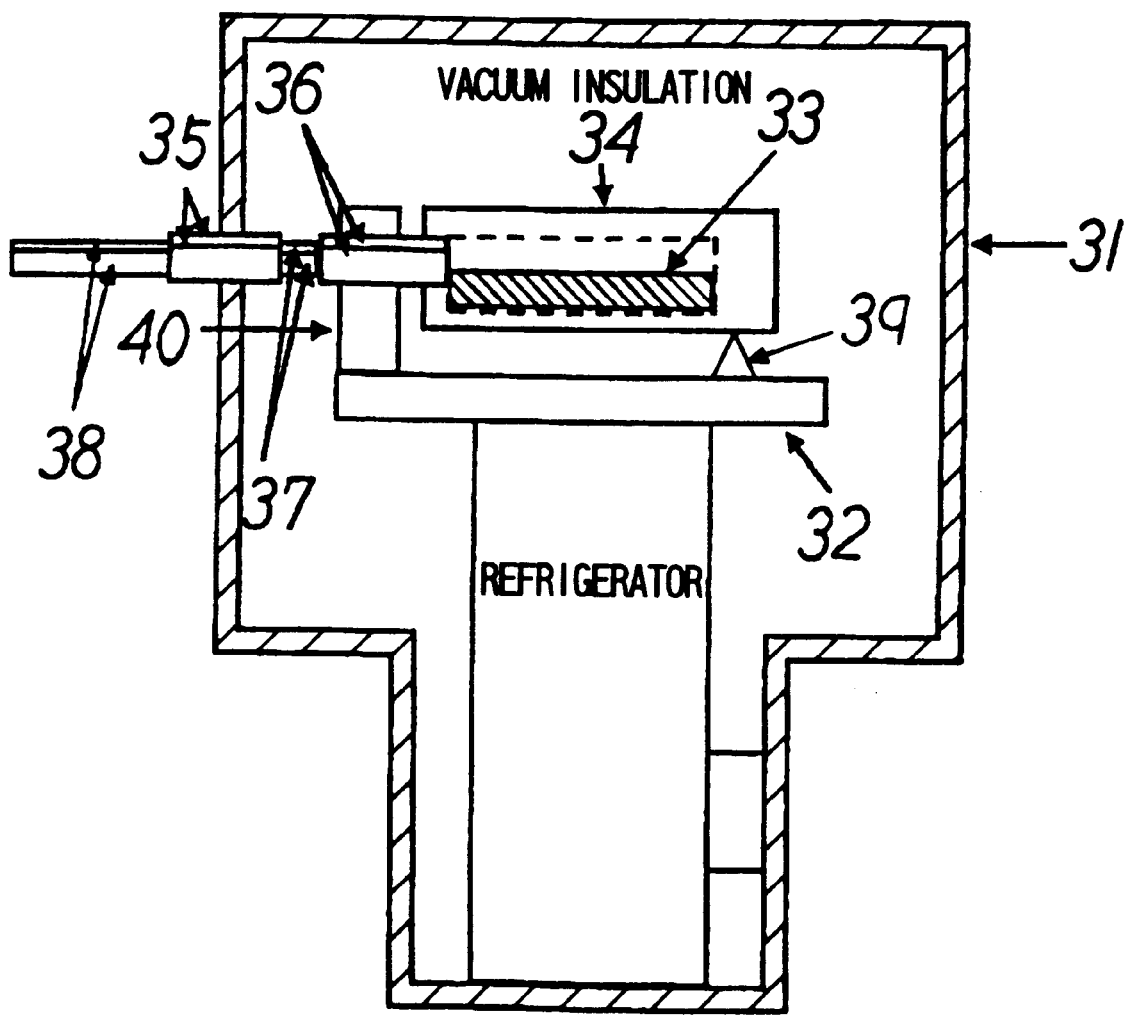
FIG. 5 is a section view showing other example of the embodiment of the electronic apparatus according to the invention.

Further, other example of the embodiment of the electronic apparatus according to the invention is shown in FIG. 5.

In FIG. 5, a vacuum heat insulation housing 31 accommodates a cold head 32 which constitutes cooling means together with e.g. a refrigerator, and an electronic device 34 is provided with an electronic circuit 33 operated at a temperature between 4 K. and 150 K.

A vacuum sealed housing-side input/output connectors 35 is disposed to penetrate a housing wall of the vacuum heat insulation housing 31, an input/output coaxial connector 36 is mounted on the electronic device 34 and electrically connected to the electronic circuit 33, a cable 37 electrically connects the housing-side input/output connector 35 and the input/output coaxial connector 36, and a cable 38 electrically connects an external electric circuit and the housing-side input/output connector 35. Usually, coaxial cables are used for the cables 37, 38, and a coaxial connector is used for the housing-side input/output connector 35.

A cooling introduction member 40 provided on the cold head 32 of the cooling means vertically sandwiches and support the input/output coaxial connector 36. By interposing such a cooling introduction member 40, the electronic device 34 can be mounted and accommodated in the vacuum heat insulation housing 31 while being separated from the cold head 32, as well as, the input/output coaxial connector 36 can be cooled by the cooling means 32 via the cooling introduction member 40. A support 39 which will not influence the temperature distribution of the electronic circuit 33 via the electronic device 34 may be provided between the electronic device 34 and the cold head 32.

Figure 3B:
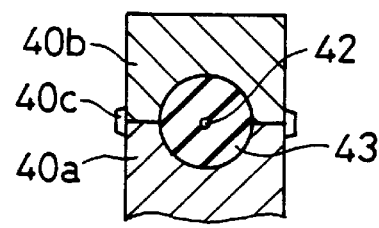

The input/output coaxial connector 36 of this embodiment has the same constitution as that of the input/output coaxial connector 26 of the preceding embodiment except the constitution of the cooling introduction member 40. The electronic device 34 attached with the electronic circuit 33 is supported by the input/output coaxial connector 36 at its one side, while at another side the support 39 is provided between the electronic device 34 and the cold head 32. As a result of this, the cooling introduction member 40 is divided into upper and lower portions 40a, 40b, and so the input/output coaxial connector 36 is fixed by engaging the portions with each other with an engaging member 40c. This condition is shown by the cross section of FIG. 3B. In the present embodiment, the dielectric 43 is surrounded by the cooling introduction member 40, so that the cooling efficiency of the dielectric is better than that in the preceding embodiment.

Though the support 39 is provided between the electronic device 34 and the cold head 32 to support the electronic device 34 in the example of FIG. 5, also such a constitution may be possible that the electronic device 34 is supported from the input/output coaxial connector 36 side via a cable and a second input/output coaxial connector whose dielectric does not necessarily have a high heat conductivity.

Figure 6:
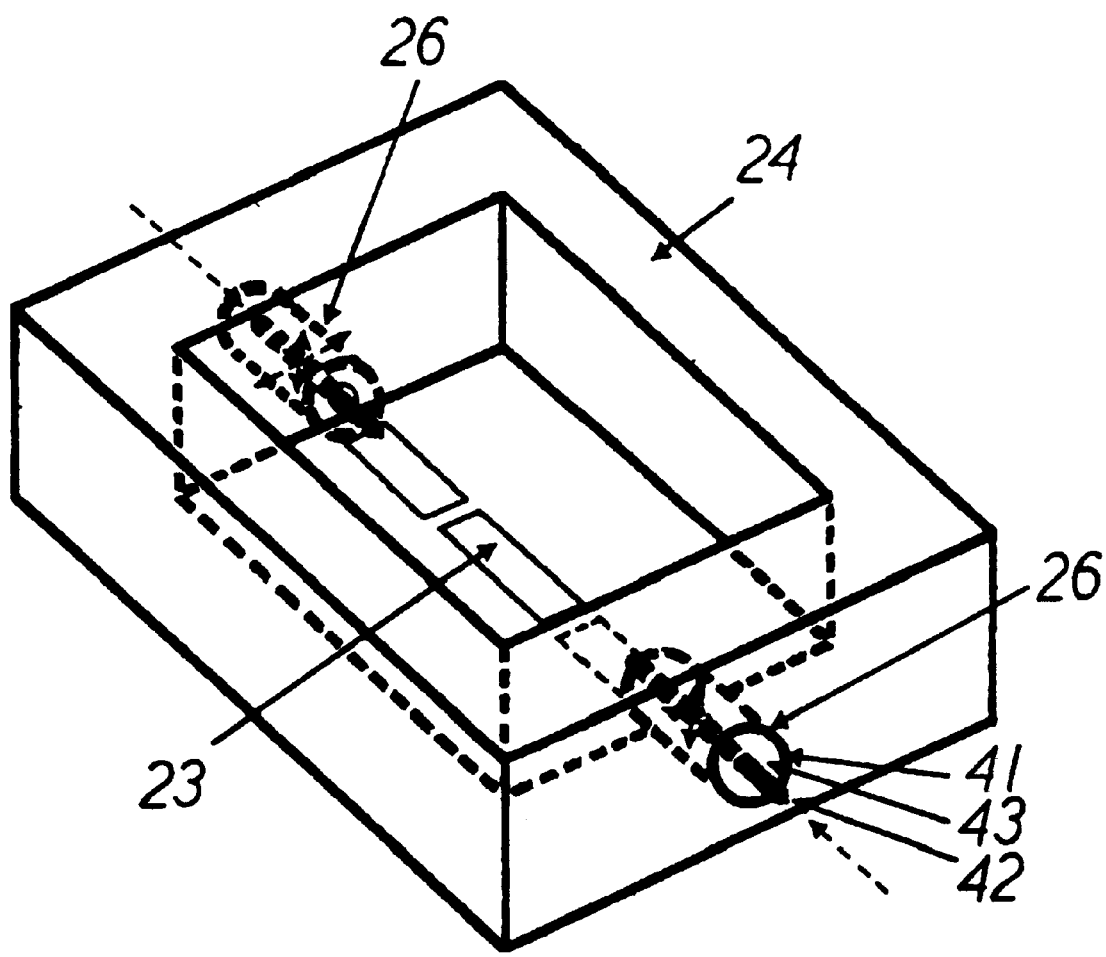
FIG. 6 is a perspective view showing the heat flowing into the electronic device through the input/output coaxial connector in the electronic apparatus of the invention.

Now, heat flowing into the electronic device in the electronic apparatus of the invention is illustrated in the perspective view of FIG. 6, taking the electronic device 24 shown in FIG. 1 as an example. The same reference numerals are given to components of FIG. 6 that correspond to those of FIG. 1. The arrows of dashed lines indicate flows of heat.

As shown in FIG. 6, in the electronic device 24 of the electronic apparatus of the invention, since the heat conductivity of the dielectric 43 in the input/output coaxial connector 26 at a temperature between 4K. and 150K. is as high as 10 W/m·K. or more, it is noted that heat having passed through the central conductor 42 from outside is efficiently diffused and conducted into the outer conductor 41 through the dielectric 43 holding the central conductor 42, then dissipated to the outside of the electronic device 24. Therefore, it is possible to intercept the heat inflow from outside at the connector 26 by intensively cooling the dielectric 43. The electronic device 24 has a vacuum heat insulating structure except the input/output coaxial connector 26 to which the cooling introduction member 28 is connected, so that the temperature of the input/output coaxial connector 26 becomes that of the entire electronic device 24, with almost no distribution of temperature in the electronic circuit 23.

From the above, unlike the electronic device 4 of the conventional electronic apparatus, the heat inflow from outside does not reach or diffuse in the electronic circuit 23 through the central conductor 42, and there are no distribution of, or local increase in temperature of the electronic circuit 23. As a result, even if the characteristics of the electronic circuit 23 cannot be obtained so much as initially designed or if a superconducting thin-film is employed in the electronic circuit 23 as the electronic device 24 that is used in a state of being cooled to near an very low temperature, there never occur a situation in which the local increase in temperature spoils a superconducting state to significantly deteriorate the characteristics of the electronic circuit 23.

In the electronic apparatus of the invention, various vacuum housings can be used as the vacuum heat insulating housing 21, 31 if they have airtightness enough to keep a vacuum of $10^{-3}$Torr or more for effective heat insulation in a vacuum, and strength enough to maintain the structure thereof in a high vacuum. As a material therefor, SUS is preferably used in particular because it is a metal of high airtightness and easy to process.

In addition, it is desirable that at least part of the inside surface of the vacuum heat insulating housing 21, 31 which comes in contact with a vacuum is cooled to the so-called liquid nitrogen temperature of 77.3 K. or lower, like the so-called liquid nitrogen trap in a vacuum housing. This is because a small amount of the air remained in the heat insulating vacuum housing 21, 31 liquefies when it comes in contact with the part cooled to the temperature of 77.3 K. so that the vacuum of the inside of the heat insulating vacuum housing 21, 31 is substantially improved, resulting in additional increase in a vacuum heat insulating effect. To further enhance the cooling effect of the electronic device 24, 34 in the electronic apparatus of the invention, it is desirable that successful vacuum heat insulation is performed to fully control the heat inflow via outside cables 27, 27'; 37, 38, the input/output coaxial connector 26, 36, and the housing side input/output connector 25, 35. As a preferable condition for that, it is desirable that at least part of the inside surface of the vacuum heat insulating housing 21, 31 which comes in contact with the vacuum, is cooled to the temperature of 77.3 K. or lower.

To cool at least the part of the inside surface of the vacuum heat insulating housing 21, 31 which comes in touch with the vacuum to the temperature of 77.3 K. or lower, the temperature of the cold head 22, 32 to be cooled to the most low temperature by a refrigerator as cooling means may be 77.3 K. or lower, for example.

The cold head (cooling means) 22, 23 is constructed of a metal or ceramics of high heat conductivity. Preferably, the cold head 22, 32 is fixed with an adhesive of good heat conduction with respect to the refrigerator, solder and wax of good heat conduction, or metal screws of good heat conduction.

As the electronic circuit 23, 33 which is cooled to a temperature between 4 K. and 150 K. for operation, various electronic circuits that are operated in a state of being cooled to a temperature of 150 K. or less can be used. On the other hand, since the heat conductivities of all the materials extremely decrease at a temperature of less than 4 K. and there is no heat inflow through the central conductor of the cable, the effects of the configuration of the electronic apparatus according to the invention cannot be obtained.

The electronic circuit 23, 33 may be any electronic circuits that operates at a temperature within the above-mentioned range. Preferably, an electronic circuit to be cooled to the so-called liquid nitrogen temperature of 77.3 K. or lower is applied to the electronic apparatus of the invention. As examples of equipment to which the electronic apparatus using the electronic circuit 23, 33 of the invention is applied, there are an infrared camera, a scanning electron microscope, a transmission electron microscope, a CCD camera with a cooling function, and an MRI (magnetic resonance image diagnosing apparatus) and the like. As the electronic circuit 23, 33, a high-frequency circuit and a digital circuit using superconductors are more preferably applied.

The electronic device 24, 34 is equipped with the electronic circuit 23, 33 that is operated in a state of being cooled to a temperature between 4 K. and 150 K., and also comprises the input/output coaxial connector 26, 36 holding the central conductor 42 by means of the dielectric 43 having a heat conductivity of 10W/m·K. or more at a temperature between 4 K. and 150 K. The structure thereof varies depending on a used frequency. As a coaxial connector for connecting a semi-rigid coaxial cable, an N type, an SMA type, an SMB type, a K type, or a W type is used. The impedance of the input/output coaxial connector 26, 36 should be 50Ω or 75Ω so that input and output of high-frequency current between the electric apparatus and outside electronic equipment can be performed with a low loss.

As described above, the input/output coaxial connector 26, 36 holds the central conductor 42 with the dielectric 43 having a heat conductivity of 10 W/m·K or more at temperatures between 4 K. and 150 K. This bases on that a heat conductivity of 10W/m·K. or more is preferable, which is one-fortieth of the heat conductivity of 400W/m·K. at a temperature of 150 K. of copper that is a general material as a central conductor because: a cross-sectional area of a central conductor in a general input/output coaxial connector is about 0.8mm$^2$; a contacting cross-sectional area of the central conductor in the connector and the dielectric holding the central conductor is about 32mm$^2$; and there is a difference of 40 times between the two cross-sectional areas. With the dielectric having the above-mentioned heat conductivity, the heat from outside does not flow easily into the electronic circuit 23, 33 through the central conductor 42 in the coaxial connector 26, 36, and is dissipated by the cooling member 28, 40 and the cooling means 22, 32 to the outside of the electronic device 24, 34 through the dielectric 43 of the coaxial connector 26, 36.

As a material for the dielectric 42 of the coaxial connector 26, 36, the use of a sintered aluminum oxide material (heat conductivity: about 20W/m·K.), a sintered aluminum nitride material (heat conductivity: about 320W/m·K.), or a sintered silicon carbide material (heat conductivity: about 490W/m·K) which is excellent at electrical insulation and of high heat conductivity, allows heat to be dissipated with more efficient because of its high heat conductivity so that the heat inflow from outside are more effectively intersected and dissipated to the outside of the electronic device 24, 34 through the dielectric 42 of the coaxial connector 26, 36.

Among the above-mentioned materials, the sintered aluminum material is particularly suitable to the electronic apparatus of the invention because it has the property of increasing in heat conductivity at a low temperature.

The sintered aluminum oxide material, the sintered aluminum material and the sintered silicon carbide material contain Al$_2$O$_3$, AlN, and SiC, respectively, as major constituents, and also may contain other constituents to be added for the purpose of improving the characteristics of impurities or something inevitable in practical use. Al$_2$O$_3$, AlN, and SiC are optimally single crystals in terms of heat conductivity, but there is no problem for them with being polycrystals.

As the cables 27, 27'; 37, 38, the coaxial cable employed in the conventional similar electronic apparatus may be used, making a choice among them as needed according to the specifications and characteristics of the electronic circuit 23, 33 to be stored. In particular, the use of the semi-rigid coaxial cable whose outer conductor is constructed of a pipe-shaped metal and is exposed outside, allows the cable to be easy to cool directly from its surface. As the dielectric of the cables 37 and 38, it is preferable to use the one having a heat conductivity of 10W/m·K. or more at a temperature between 4 K. and 150 K. so that the heat flowing into the electronic device 23, 33 can be further decreased and the characteristics with respect to an electric signal of a long wavelength is enhanced. In this case, the above-described semi-rigid coaxial cable connector may be used as the coaxial connector 26, 36 and a dielectric having a heat conductivity of 10W/m·K. at a temperature between 4 K. and 150 K. may be used as their dielectric.

There is no specific limit on the number of the cables connected to the electric circuit 23, 33, and as many cables as needed for the electric circuit 23, 33 may be connected. Also, no specific limit is placed on how to align a plurality of cables, and it is needless to say that an any required cabling pattern may be employed in which the input/output coaxial connector of the electric device connected to those cables is connected to and cooled by the cooling introduction member.

The cooling member 28, 40 connected to the coaxial connector 26, 36 may be constructed of a metal or ceramics having a high heat conductivity in order to cool, for example, the coaxial connector 26, 36 with high efficiency.

EXAMPLES

Hereinafter concrete examples of the electronic apparatus of the invention will be shown.

EXAMPLE 1

Based on the following structure and conditions, the electronic apparatus of the invention having the composition shown in FIG. 1 has been prepared.

Electronic circuit 23: A superconducting filter made on a LaAlO$_3$ substrate of 20mm long by 20mm wide by 0.5mm thick Body of the electronic device 24: Copper Input/output coaxial connector 26: A SMA coaxial connector in which a sintered polycrystalline aluminum oxide material is used in the dielectric Cable 27: A 0.028-inch-diameter semi-rigid coaxial cable of 10cm long The temperature of the cooling means 22: 50 K.

The external environmental temperature of the electronic apparatus: 300 K.

Then, the distribution of temperature at the following four points A to D on the electronic device 24 or the electronic circuit 23 has been measured using a thermocouple, with the result below:

A (Location: The surface of the electronic device 24 above the coaxial connector 26): 60 K.

B (Location: The surface of the end of the electronic circuit 23 on one side of the input/output coaxial connector 26): 58 K.

C (Location: The middle surface of the electronic circuit 23): 56 K.

D (Location: The surface of the end of the electronic circuit 23 on the other side of the input/output coaxial connector 26): 58 K.

As seen above, according to the electronic apparatus of the invention, temperature differentials in the electronic circuit 23 that is operated in a state of being cooled to a temperature between 4 K. and 150 K. have been found to be as extremely small as 2 K. (=2°C.).

EXAMPLE 2

Based on the following structure and conditions, the electronic apparatus of the invention having the composition shown in FIG. 5 has been prepared.

Electronic circuit 33: A superconducting filter made on a $LaAlO_3$ substrate of 20mm long by 20mm wide by 0.5mm thick Body of the electronic device 34: Copper Input/output coaxial connector 36: A SMA coaxial connector in which a sintered polycrystalline aluminum oxide material is used in the dielectric Cable 37: A 0.028-inch-diameter semi-rigid coaxial cable of 5cm long Cable 39: A 0.028-inch-diameter semi-rigid coaxial cable of 3cm long The temperature of the cooling means 32: 50 K.

The external environmental temperature of the

Then, the distribution of of temperature at the following four points A to D on the electronic device 34 or the electronic circuit 33 has been measured using a thermocouple, with the result below:

A (Location: The surface of the electronic device 34 above the input/output coaxial connector 36): 70 K.

B (Location: The surface of the end of the electronic circuit 33 on one side of the input/output coaxial connector 36): 68 K.

C (Location: The middle surface of the electronic circuit 33): 68 K.

D (Location: The surface of the end of the electronic circuit 23 on the other side of the input/output coaxial connector 26): 68 K.

Thus, according to the electric apparatus of the invention, it has been revealed that there was no temperature differential in the electric circuit 33 that is operated in a state of being cooled to a temperature between 4 K. and 150 K., providing an uniform temperature distribution.

EXAMPLE 3

Comparative Example

Figure 7:
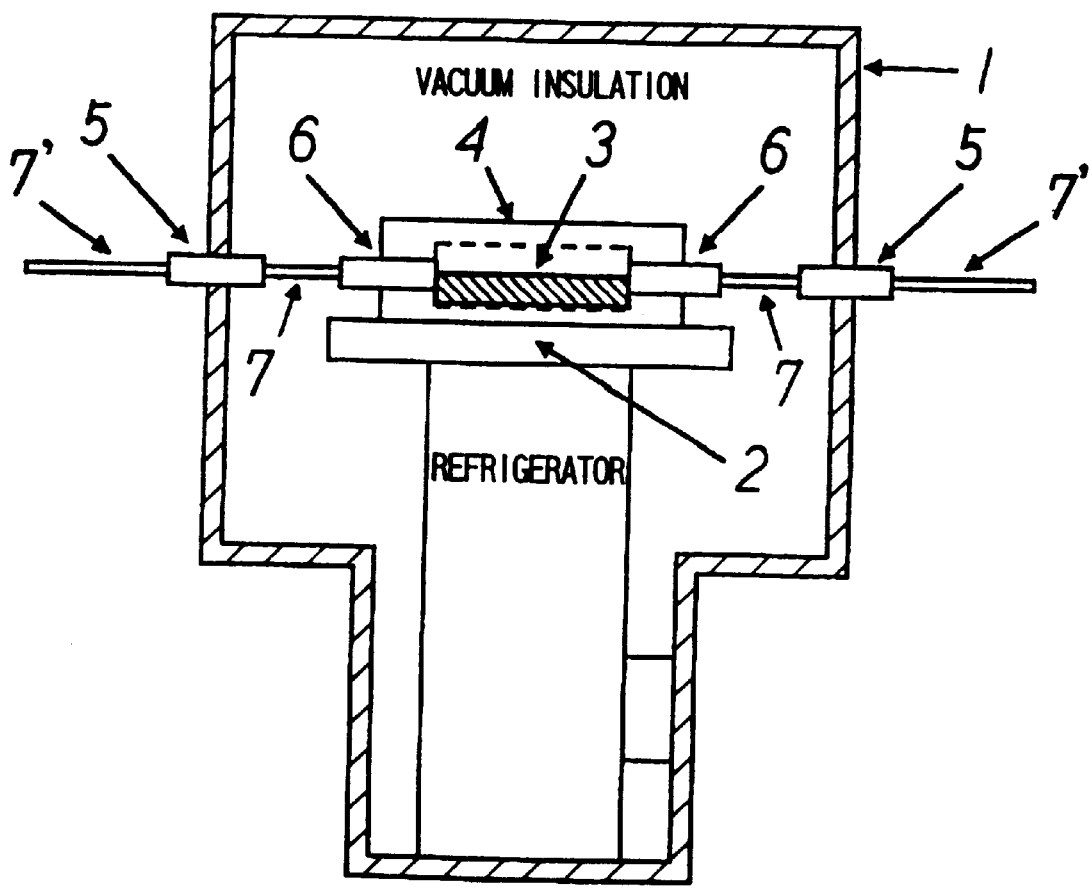
FIG. 7 is a section view showing a structure of a conventional electronic apparatus.
Figure 8A:
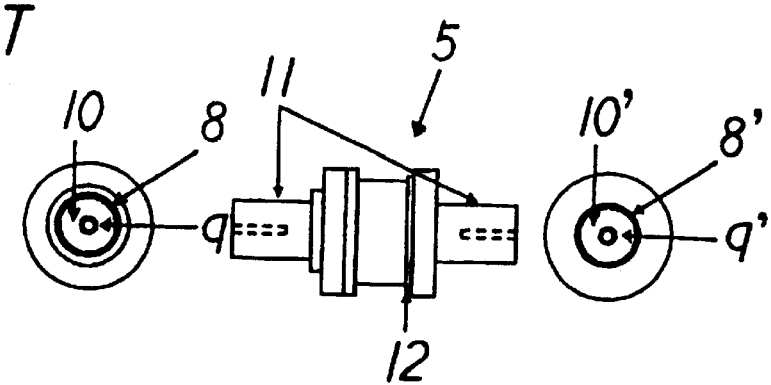
FIGS. 8A to 8C are front views and side views of the housing-side input/output connector, the input/output coaxial connector and the cable, respectively.
Figure 8B:
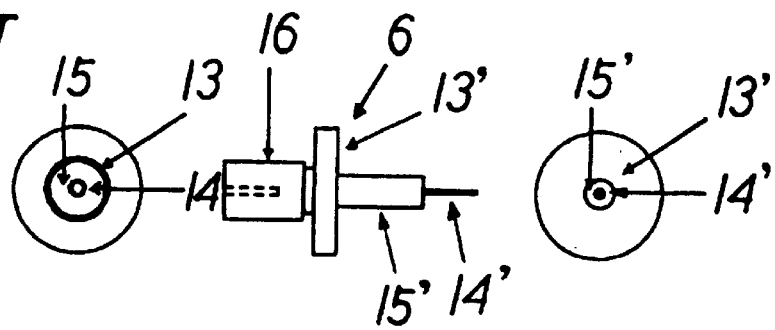
Figure 8C:
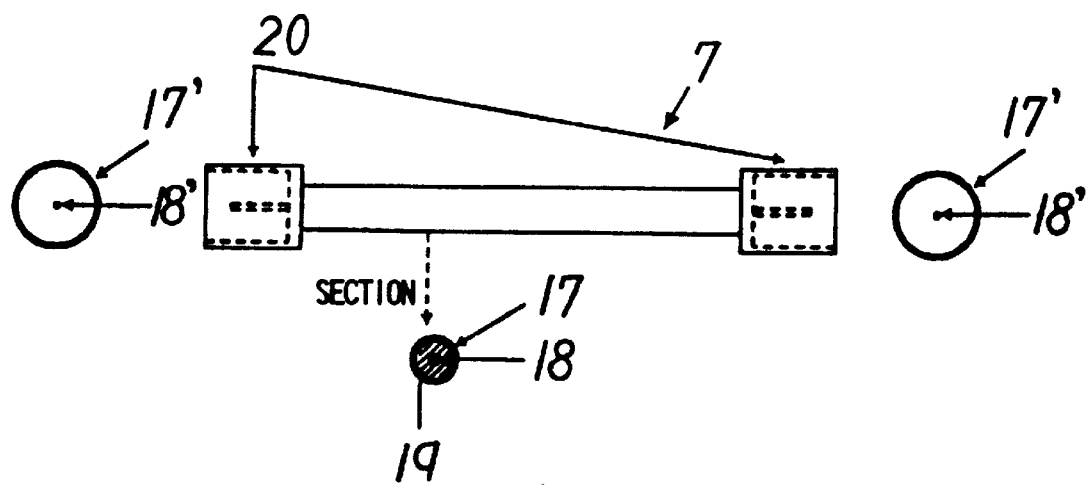
Figure 9:
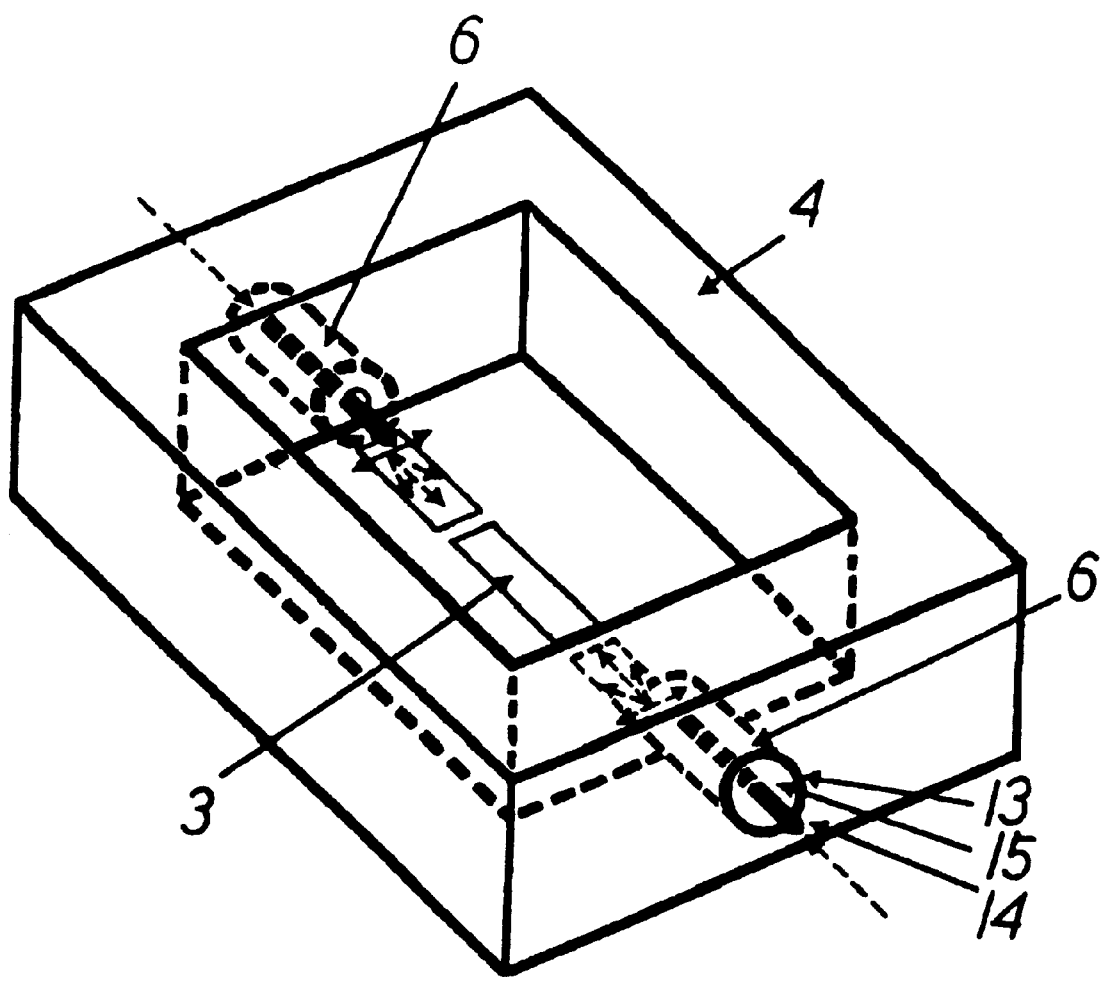
FIG. 9 is a perspective view showing the heat flowing into the electronic device through an input/output coaxial connector in the conventional electronic apparatus.

Based on the following structure and conditions, the electronic apparatus of the invention having the composition shown in FIG. 7 has been prepared.

Electronic circuit 3: A superconducting filter made on a $LaAlO_3$ substrate of 20mm long by 20mm wide by 0.5mm thick Body of the electronic device 34: Copper Input/output coaxial connector 6: A SMA coaxial connector in which a tetrafruoro resin is used in the dielectric Cable 7: A 0.028-inch-diameter semi-rigid coaxial cable of 10cm long The temperature of the cooling means 2: 50 K.

The external environmental temperature of the electronic apparatus: 300 K.

Then, the distribution of temperature at the following four points A to D on the electronic device 4 or the electronic circuit 3 has been measured using a thermocouple, with the result below:

A (Location: The surface of the electronic device 4 above the input/output coaxial connector 6): 58 K.

B (Location: The surface of the end of the electronic circuit 3 on one side of the input/output coaxial connector 6): 65 K.

C (Location: The middle surface of the electronic circuit 3): 60 K.

D (Location: The surface of the end of the electronic circuit 3 on the other side of the input/output coaxial connector 6): 65 K.

As seen above, according to the electronic apparatus of the invention, it has been revealed that there was as large temperature differentials as 5 K. (=5°C.) in the electronic circuit 3 to be cooled to a temperature between 4 K. and 150 K. for operation. Compared with the result on the electronic apparatus of the invention shown in Example 1, it is noted that the end of the electronic circuit (B or D) showed a temperature increase of 7 K. (=7°C.). These temperature differentials would pose a big barrier to matching the characteristics of the electronic circuit 3 in use to specified values, and become a problem in practical use. Especially when the electronic circuit 3 uses an oxide superconductor having a critical temperature between 80 K. and 120 K., this temperature distribution will deteriorate a superconducting characteristic, presenting a problem in practical use.

The application of the invention is not limited to the above-described cases, and can be changed and modified in various ways within the range of not departing from the abstract of the invention. For example, liquid gas such as liquid nitrogen and liquid helium can be used as a source of cooling by the cooling mean 22, 32, instead of a refrigerator. In addition, a very-low-heat conducting material such as Styrofoam can be used in heat insulating of the electronic devices 24 and 34, instead of vacuum heat insulating.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An electronic apparatus comprising:

an electronic device accommodated in a vacuum heat insulation housing, provided with an electronic circuit which is cooled to a temperature between 4 K. and 150 K. to operate, and an input/output coaxial connector; and cooling means accommodated in the vacuum heat insulation housing, for cooling the electronic device to the temperature between 4 K. and 150 K. via a cooling introduction member connected with the input/output coaxial connector, wherein the electronic device is mounted in a state of being separated from the cooling means and the input/output coaxial connector is constructed to hold a central conductor with a dielectric having a heat conductivity of 10 W/m·K. or more at the temperature between 4 K. and 150 K.

2. The electronic apparatus of claim 1, wherein the dielectric of the input/output coaxial connector is formed of a sintered aluminum oxide material, a sintered aluminum nitride material or a sintered silicon carbide material.

3. The electronic apparatus of claim 1, wherein the input/output coaxial connector is a coaxial connector to which a semi-rigid coaxial cable with an outer conductor exposed outside can be connected.

4. The electronic apparatus of claim 2, wherein the input/output coaxial connector is a coaxial connector to which a semi-rigid coaxial cable with an outer conductor exposed outside can be connected.

5. The electronic apparatus of claim 3, wherein a semi-rigid coaxial cable is connected to the input/output coaxial connector, and that the dielectric of the semi-rigid coaxial cable has a heat conductivity of 10 W/m·K. or more at the temperature between 4 K. and 150 K.

6. The electronic apparatus of claim 4, wherein a semi-rigid coaxial cable is connected to the input/output coaxial connector, and that the dielectric of the semi-rigid coaxial cable has a heat conductivity of 10 W/m·K. or more at the temperature between 4 K. and 150 K.

* * * * *